(12) United States Patent
Yang

(10) Patent No.: US 11,264,974 B2
(45) Date of Patent: Mar. 1, 2022

(54) PROCESSING CIRCUIT USING DELAY ELEMENT COUPLED BETWEEN CONTROL TERMINAL AND CONNECTION TERMINAL OF INPUT TRANSISTOR FOR HOLD TIME VIOLATION IMMUNITY

(71) Applicant: MEDIATEK INC., Hsin-Chu (TW)

(72) Inventor: Jen-Hang Yang, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 17/151,672

(22) Filed: Jan. 19, 2021

(65) Prior Publication Data

US 2021/0297066 A1  Sep. 23, 2021

Related U.S. Application Data

(60) Provisional application No. 62/991,094, filed on Mar. 18, 2020.

(51) Int. Cl.
  *H03K 3/037* (2006.01)
(52) U.S. Cl.
  CPC .......... *H03K 3/037* (2013.01); *H03K 3/0375* (2013.01)
(58) Field of Classification Search
  CPC ............... H03K 3/012; H03K 3/0375; H03K 3/356113; H03K 3/356121; H03K 3/356182; H03K 3/356191
  See application file for complete search history.

(56) References Cited

U.S. PATENT DOCUMENTS

| 5,160,863 A | 11/1992 | Hui |
| 6,034,548 A | 3/2000 | Churcher |
| 6,255,879 B1 | 7/2001 | Voss |
| 6,448,833 B2 | 9/2002 | Hirose |
| 7,649,395 B2* | 1/2010 | Ahmadi ........... G01R 31/31858 327/202 |
| 10,361,686 B2* | 7/2019 | Hsieh .................. H03K 3/35625 |
| 2016/0098506 A1* | 4/2016 | Agarwal ............. G06F 30/3312 327/225 |

\* cited by examiner

*Primary Examiner* — Patrick O Neill
(74) *Attorney, Agent, or Firm* — Winston Hsu

(57) ABSTRACT

A processing circuit includes an input circuit and a follow-up circuit. The input circuit includes a first transistor, a second transistor, and a delay element. The first transistor has a control terminal, a first connection terminal, and a second connection terminal. The control terminal of the first transistor is arranged to receive a data signal. A first connection terminal of the second transistor is coupled to the second connection terminal of the first transistor, and a control terminal of the second transistor is arranged to receive a first non-data signal. The delay element is coupled between the control terminal and the second connection terminal of the first transistor. A data input is received at an input node of the follow-up circuit, and the input node of the follow-up circuit is coupled to the second connection terminal of the second transistor.

20 Claims, 8 Drawing Sheets

PROCESSING CIRCUIT USING DELAY ELEMENT COUPLED BETWEEN CONTROL TERMINAL AND CONNECTION TERMINAL OF INPUT TRANSISTOR FOR HOLD TIME VIOLATION IMMUNITY

CROSS REFERENCE TO RELATED APPLICATIONS

This application claims the benefit of U.S. provisional application No. 62/991,094, filed on Mar. 18, 2020 and incorporated herein by reference.

BACKGROUND

The disclosed embodiments of the present invention relate to a circuit design, and more particularly, to a processing circuit using a delay element (e.g., a capacitive element) coupled between a control terminal (e.g., gate) and a connection terminal (e.g., drain) of an input transistor for hold time violation immunity.

Setup and hold time checks are the most common types of timing checks used in timing verification of an integrated circuit layout design. For example, synchronous inputs have setup and hold time specification with respect to the clock input. These checks specify that the data input must remain stable for a specified time period just before and just after the clock edge. The time period just before the clock edge is called setup time. The time period just after the clock edge is called hold time. When timing verification of an integrated circuit layout design indicates timing violation (e.g., setup time violation and/or hold time violation), the integrated circuit layout design needs proper modification to meet the timing requirement (e.g., setup time constraint and/or hold time constraint).

In the field of digital designs, physical designers generally use hold time fixing buffers or delay cells to make timing meet the hold time constrain. However, inserting hold time fixing buffers or delay cells for delaying the data input will consume large leakage and power. Thus, there is a need for an innovative circuit design that can meet the hold time constrain with less leakage and power penalty.

SUMMARY

In accordance with exemplary embodiments of the present invention, a processing circuit using a delay element (e.g., a capacitive element) coupled between a control terminal (e.g., gate) and a connection terminal (e.g., drain) of an input transistor for hold time violation immunity is proposed.

According to a first aspect of the present invention, an exemplary processing circuit is disclosed. The exemplary processing circuit includes an input circuit and a follow-up circuit. The input circuit includes: a first transistor, having a first connection terminal, a second connection terminal, and a control terminal, wherein the control terminal of the first transistor is arranged to receive a data signal; a second transistor, having a first connection terminal, a second connection terminal, and a control terminal, wherein the first connection terminal of the second transistor is coupled to the second connection terminal of the first transistor, and the control terminal of the second transistor is arranged to receive a first non-data signal; and a delay element, coupled between the control terminal and the second connection terminal of the first transistor. The follow-up circuit is arranged to receive a data input from the input circuit and generate a data output according to the data input, wherein the data input is received at an input node of the follow-up circuit, and the input node of the follow-up circuit is coupled to the second connection terminal of the second transistor.

According to a second aspect of the present invention, an exemplary processing circuit implemented in a flip-flop is disclosed. The exemplary processing circuit includes an input circuit and a follow-up circuit. The input circuit includes: a first transistor, having a first connection terminal, a second connection terminal, and a control terminal, wherein the control terminal of the first transistor is arranged to receive a first data signal; a second transistor, having a first connection terminal, a second connection terminal, and a control terminal, wherein the first connection terminal of the second transistor is coupled to the second connection terminal of the first transistor, and the control terminal of the second transistor is arranged to receive a first non-data signal; a third transistor, having a first connection terminal, a second connection terminal, and a control terminal, wherein the control terminal of the third transistor is arranged to receive a second data signal; a fourth transistor, having a first connection terminal, a second connection terminal, and a control terminal, wherein the first connection terminal of the fourth transistor is coupled to the second connection terminal of the third transistor, and the control terminal of the second transistor is arranged to receive a second non-data signal that is an inverse of the first non-data signal; a fifth transistor, having a first connection terminal, a second connection terminal, and a control terminal, wherein the control terminal of the first transistor is arranged to receive a second data signal; a sixth transistor, having a first connection terminal, a second connection terminal, and a control terminal, wherein the first connection terminal of the sixth transistor is coupled to the second connection terminal of the fifth transistor, and the control terminal of the second transistor is arranged to receive the second non-data signal; a seventh transistor, having a first connection terminal, a second connection terminal, and a control terminal, wherein the control terminal of the seventh transistor is arranged to receive the second data signal; an eighth transistor, having a first connection terminal, a second connection terminal, and a control terminal, wherein the first connection terminal of the eighth transistor is coupled to the second connection terminal of the seventh transistor, and the control terminal of the eighth transistor is arranged to receive the first non-data signal; and at least one delay element, coupled between the control terminal and the second connection terminal of at least one of the first transistor, the third transistor, the fifth transistor, and the seventh transistor. The follow-up circuit is arranged to receive a data input from the input circuit and generate a data output according to the data input, wherein the data input is received at an input node of the follow-up circuit, and the input node of the follow-up circuit is coupled to the second connection terminal of the second transistor, the second connection terminal of the fourth transistor, the second connection terminal of the sixth transistor, and the second connection terminal of the eighth transistor. One of the first data signal and the second data signal is a normal-mode data input of the flip-flop, and another of the first data signal and the second data signal is a test-mode data input of the flip-flop.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is electrically connected to another device, that connection may be through a direct electrical connection, or through an indirect electrical connection via other devices and connections.

Figure 1:
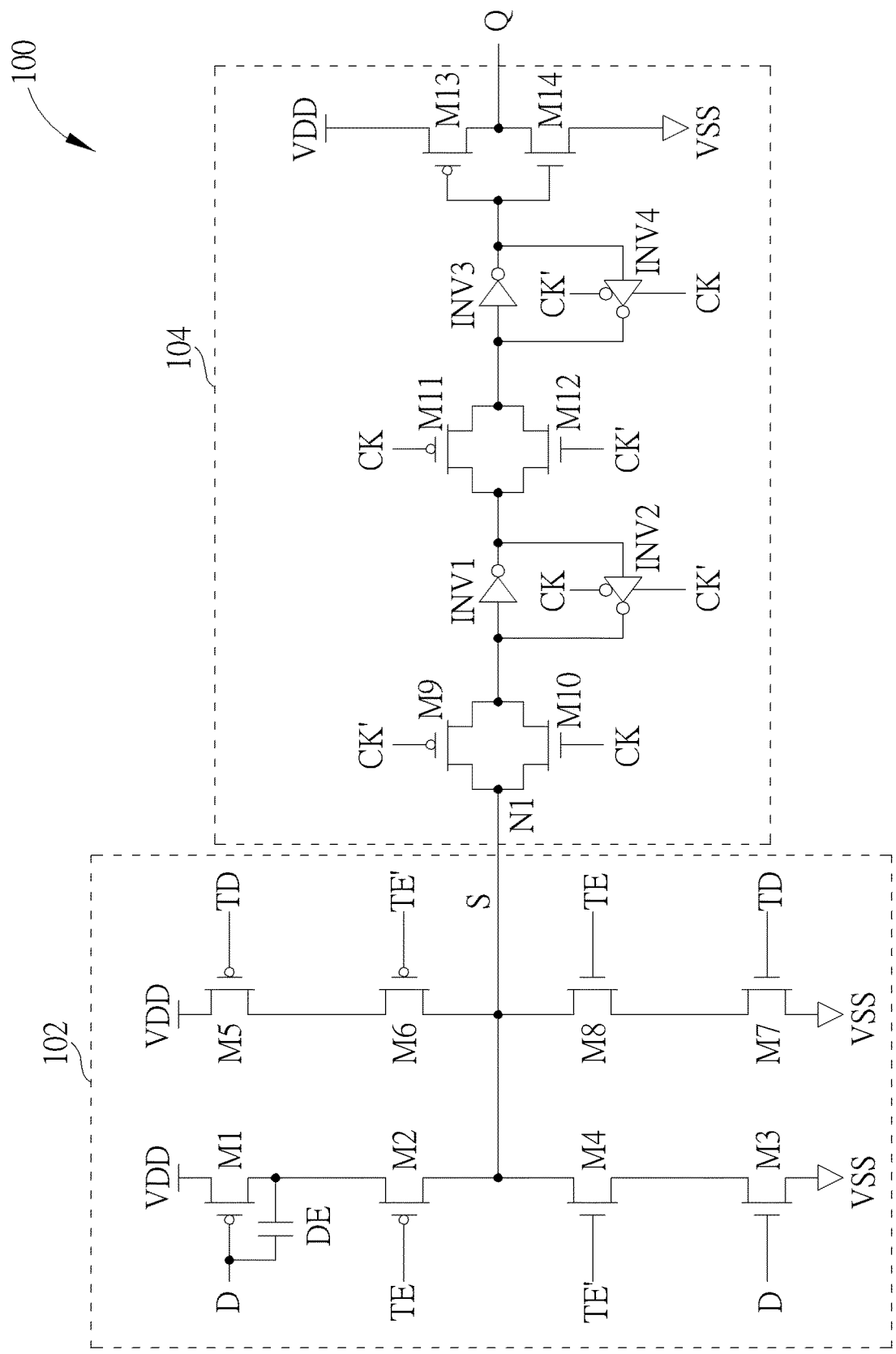
FIG. 1 is a diagram illustrating a processing circuit according to a first embodiment of the present invention.

FIG. 1 is a diagram illustrating a processing circuit according to a first embodiment of the present invention. The processing circuit 100 includes an input circuit 102 and a follow-up circuit 104. For better understanding of technical features of the present invention, the following assumes that the processing circuit 100 is implemented in a flip-flop. However, this is for illustrative purposes only, and is not meant to be a limitation of the present invention. In practice, any semiconductor circuit using the proposed hold time fixing technique falls within the scope of the present invention.

The input circuit 102 includes a plurality of transistors M1, M2, M3, M4, M5, M6, M7, and M8. In this embodiment, the transistors M1, M2, M5, and M6 are p-channel metal-oxide-semiconductor (PMOS) transistors each having a control terminal (i.e., gate) and two connection terminals (i.e., drain and source), and the transistors M3, M4, M7, and M8 are n-channel metal-oxide-semiconductor (NMOS) transistors each having a control terminal (i.e., gate) and two connection terminals (i.e., drain and source).

The transistors M1 and M3 act as input transistors for a normal mode. The source of the transistor M1 is coupled to one reference voltage (e.g., supply voltage VDD), and the gate of the transistor M1 acts as a data input terminal for receiving a data signal D. The source of the transistor M2 is coupled to the drain of the transistor M1, the gate of the transistor M2 acts as a test-enable terminal for receiving a non-data signal TE, and the drain of the transistor M2 is coupled to an input node N1 of the follow-up circuit 104. The source of the transistor M3 is coupled to another reference voltage (e.g., ground voltage VSS), and the gate of the transistor M3 acts as a data input terminal for receiving the data signal D. The source of the transistor M4 is coupled to the drain of the transistor M3, the gate of the transistor M4 acts as a test-enable terminal for receiving another non-data signal TE' (which is an inverse of the non-data signal TE), and the drain of the transistor M4 is coupled to the input node N1 of the follow-up circuit 104.

The transistors M5 and M7 act as input transistors for a test mode (scan mode). The source of the transistor M5 is coupled to one reference voltage (e.g., supply voltage VDD), and the gate of the transistor M5 acts as a data input terminal for receiving another data signal TD. The source of the transistor M6 is coupled to the drain of the transistor M5, the gate of the transistor M6 acts as a test-enable terminal for receiving the non-data signal TE', and the drain of the transistor M6 is coupled to the input node N1 of the follow-up circuit 104. The source of the transistor M7 is coupled to another reference voltage (e.g., ground voltage VSS), and the gate of the transistor M7 acts as a data input terminal for receiving the data signal TD. The source of the transistor M8 is coupled to the drain of the transistor M7, the gate of the transistor M8 acts as a test-enable terminal for receiving the non-data signal TE', and the drain of the transistor M8 is coupled to the input node N1 of the follow-up circuit 104.

The data signal D is a normal-mode data input of the processing circuit (e.g., flip-flop) 100. The data signal TD is a test-mode (scan-mode) data input of the processing circuit (e.g., flip-flop) 100. The configuration of transistors M1, M2, M3, and M4 is like a tri-state inverter that is used to perform signal inversion, only when the non-data signal TE is at a logic low level and the non-data signal TE' is at a logic high level. In addition, the configuration of transistors M5, M6, M7, and M8 is like a tri-state inverter that is used to perform signal inversion, only when the non-data signal TE is at a logic high level and the non-data signal TE' is at a logic low level. Hence, when the non-data signal TE is set by a logic low level and the non-data signal TE' is set by a logic high level, the processing circuit (e.g., flip-flop) 100 operates in a normal mode, such that a data input S received at the input node N1 of the follow-up circuit 104 is derived from the data signal D. When the non-data signal TE is set by a logic high level and the non-data signal TE' is set by a logic low level, the processing circuit (e.g., flip-flop) 100 operates in a test mode (scan mode), such that the data input S received at the input node N1 of the follow-up circuit 104 is derived from the data signal TD.

The follow-up circuit 104 is arranged to receive the data input S from the input circuit 102 and generate a data output Q according to the data input S. As shown in FIG. 1, the follow-up circuit 104 includes transistors M9, M1, M11, M12, M13, M14, inverters INV1, INV3, and tri-state inverters INV2, INV4. In this embodiment, transistors M9, M11, and M13 are PMOS transistors, and transistors M10, M12, and M14 are NMOS transistors. One transmission gate is composed of transistors M9 and M10, and is controlled by clock signals CK and CK', where the clock signal CK' is an inverse of the clock signal CK. Another transmission gate is composed of transistors M11 and M12, and is controlled by clock signals CK and CK'. The inverter INV1 and the tri-state inverter INV2 (which is controlled by clock signals CK and CK') form one latch circuit. The inverter INV3 and the tri-state inverter INV4 (which is controlled by clock signals CK and CK') form another latch circuit. The transistors M13 and M14 form an inverter that is arranged to output the data output Q. Since the present invention focuses on the design of the input circuit 102 for hold time violation immunity, further description directed to the principle of the follow-up circuit 104 is omitted here for brevity. It should be noted that the configuration of the follow-up circuit 104 may be adjusted, depending upon actual design considerations.

Figure 2:
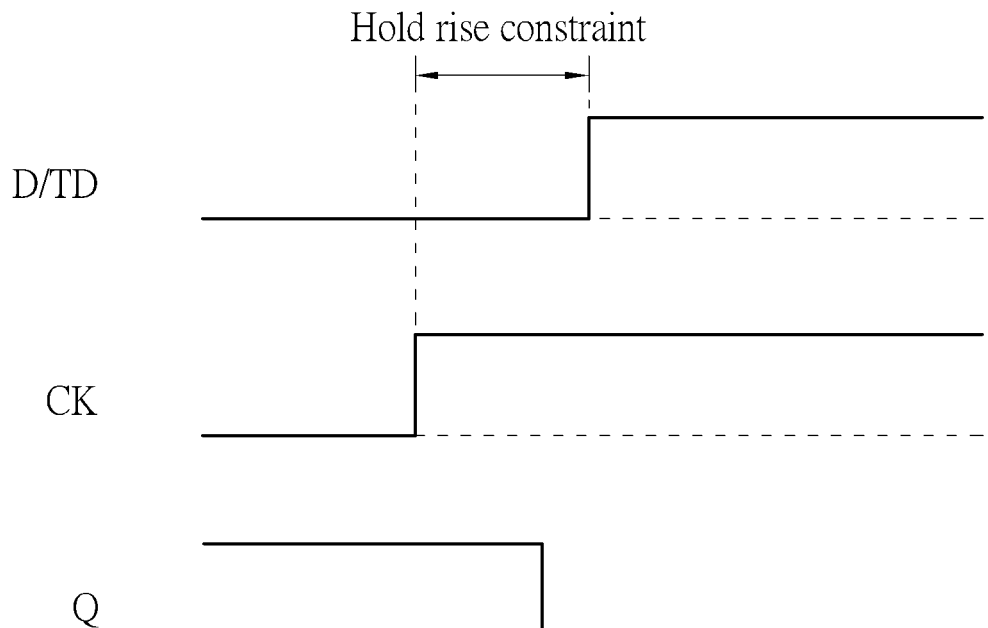
FIG. 2 is a diagram illustrating a hold rise constraint that can be met by a processing circuit using the proposed hold time fixing technique.
Figure 3:
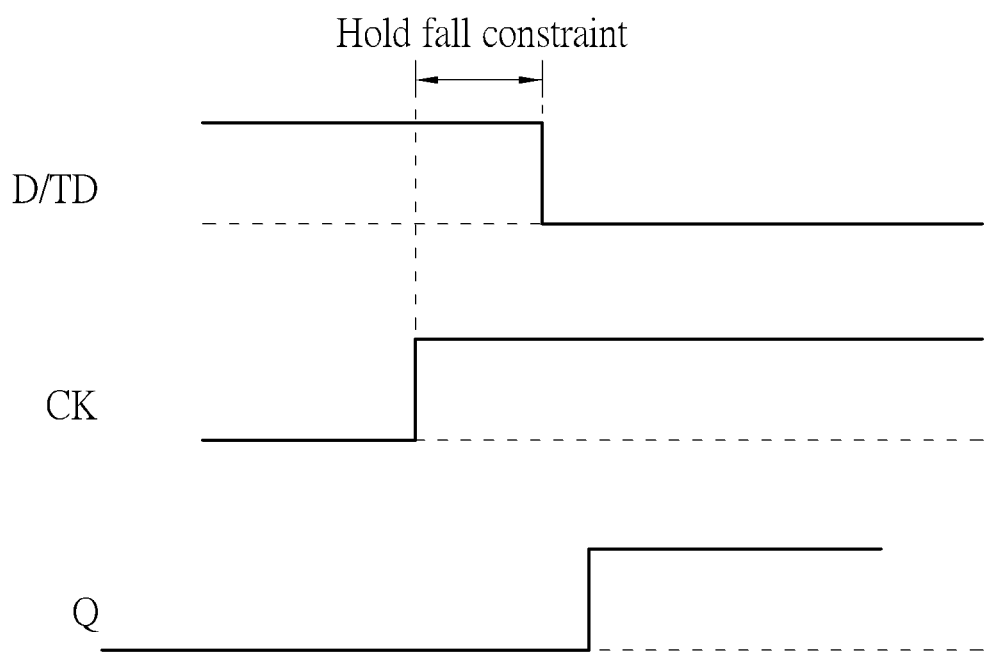
FIG. 3 is a diagram illustrating a hold fall constraint that can be met by a processing circuit using the proposed hold time fixing technique.

The processing circuit (e.g., flip-flop) 100 is required to meet certain timing requirements including a hold time constraint. The hold time constraint may include a hold rise constraint as shown in FIG. 2 and a hold fall constraint as shown in FIG. 3, where the hold rise constraint is applied under a condition that the input data has a rising edge and the output data has a falling edge after the clock edge, and the hold fall constraint is applied under a condition that the input data has a falling edge and the output data has a rising edge after the clock edge. In accordance with the proposed hold time fixing design, a delay element DE is coupled between gate and drain of the transistor M1 to fix the hold rise constraint violation under the normal mode of the processing circuit (e.g., flip-flop) 100. For example, the delay element DE may be simply implemented by a capacitive element with well-defined capacitance. In contract to inserting a hold time fixing buffer or delay cells, the proposed hold time fixing design may use capacitance to induce more delay to meet the hold time constraint (e.g., hold rise constraint and/or hold fall constraint). The use of the proposed hold time fixing design can make the processing circuit (e.g., flip-flop) 100 meet the hold time requirement much easier without consuming large leakage and power. Since the input circuit 102 has four input transistors M1, M3, M5, and M7, the same hold time fixing technique may be applied to any input transistor that requires hold time violation fixing.

Figure 4:
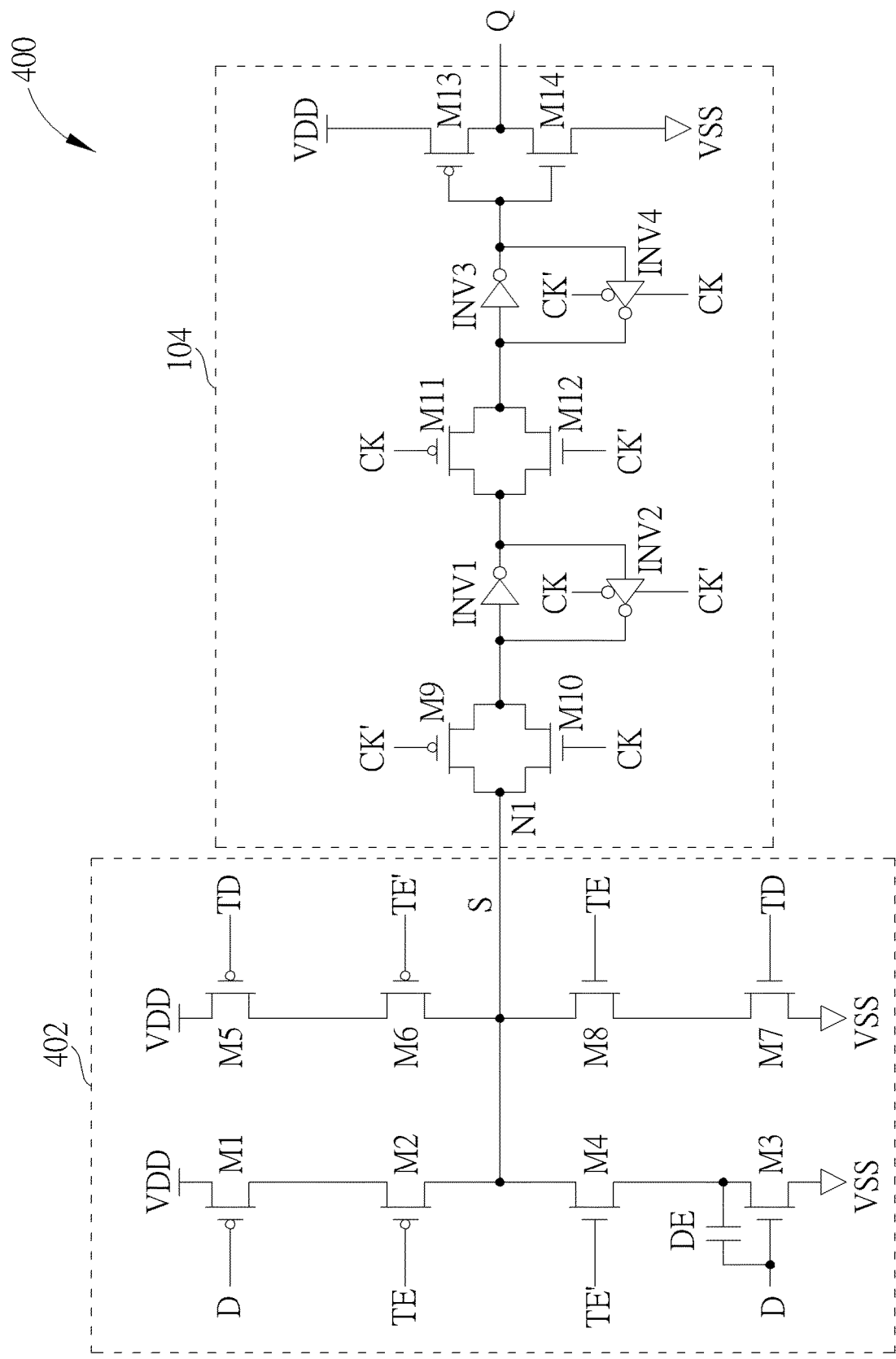
FIG. 4 is a diagram illustrating a processing circuit according to a second embodiment of the present invention.

FIG. 4 is a diagram illustrating a processing circuit according to a second embodiment of the present invention. The processing circuit 400 includes an input circuit 402 and the aforementioned follow-up circuit 104. By way of example, but not limitation, the processing circuit 400 may be implemented in a flip-flop. The major difference between the input circuit 102 and 402 is that the input circuit 402 has the delay element DE coupled between gate and drain of the transistor M3 to fix the hold fall constraint violation under the normal mode of the processing circuit (e.g., flip-flop) 400.

Figure 5:
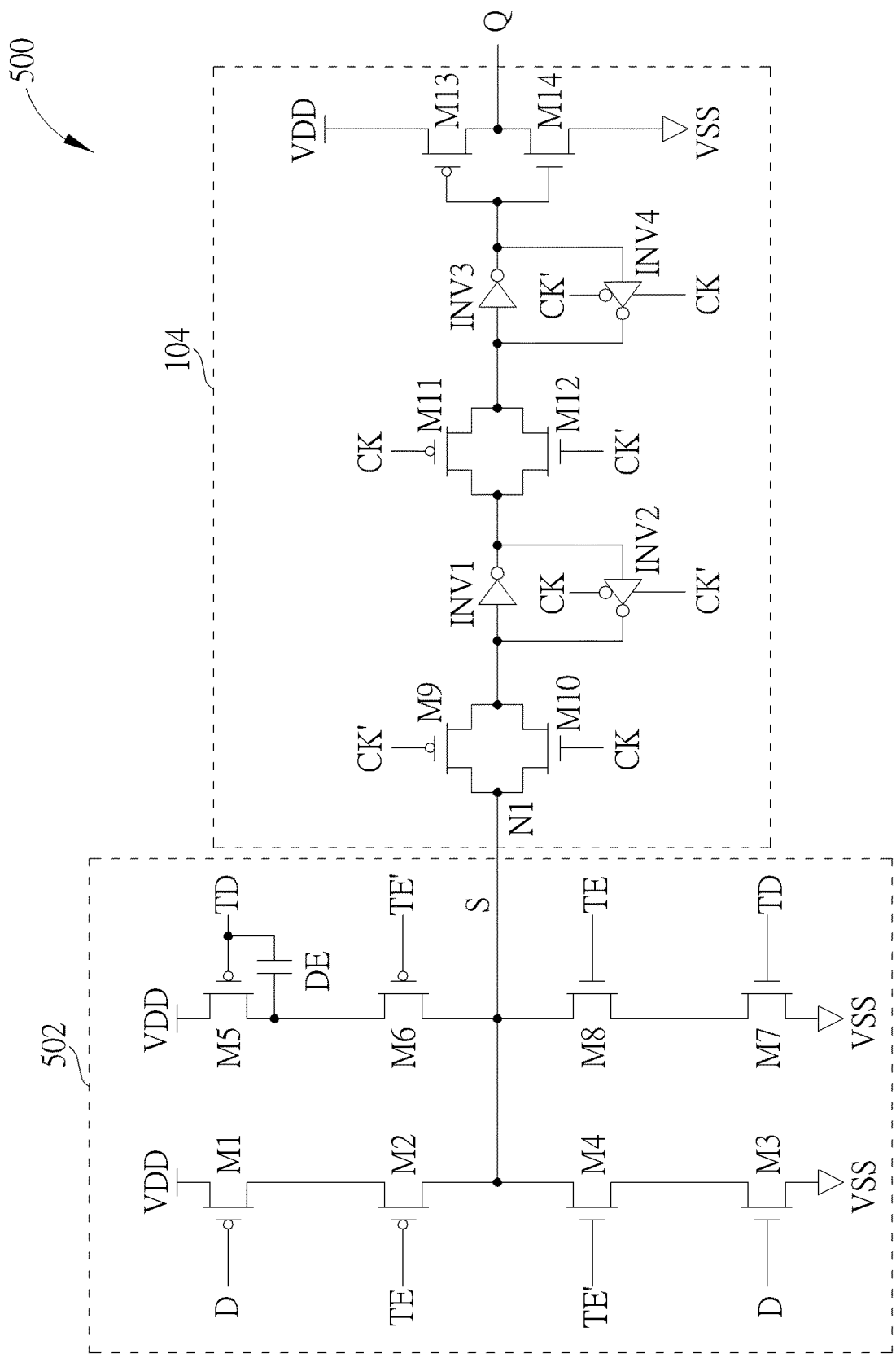
FIG. 5 is a diagram illustrating a processing circuit according to a third embodiment of the present invention.

FIG. 5 is a diagram illustrating a processing circuit according to a third embodiment of the present invention. The processing circuit 500 includes an input circuit 502 and the aforementioned follow-up circuit 104. By way of example, but not limitation, the processing circuit 500 may be implemented in a flip-flop. The major difference between the input circuit 102 and 502 is that the input circuit 502 has the delay element DE coupled between gate and drain of the transistor M5 to fix the hold rise constraint violation under the test mode (scan mode) of the processing circuit (e.g., flip-flop) 400.

Figure 6:
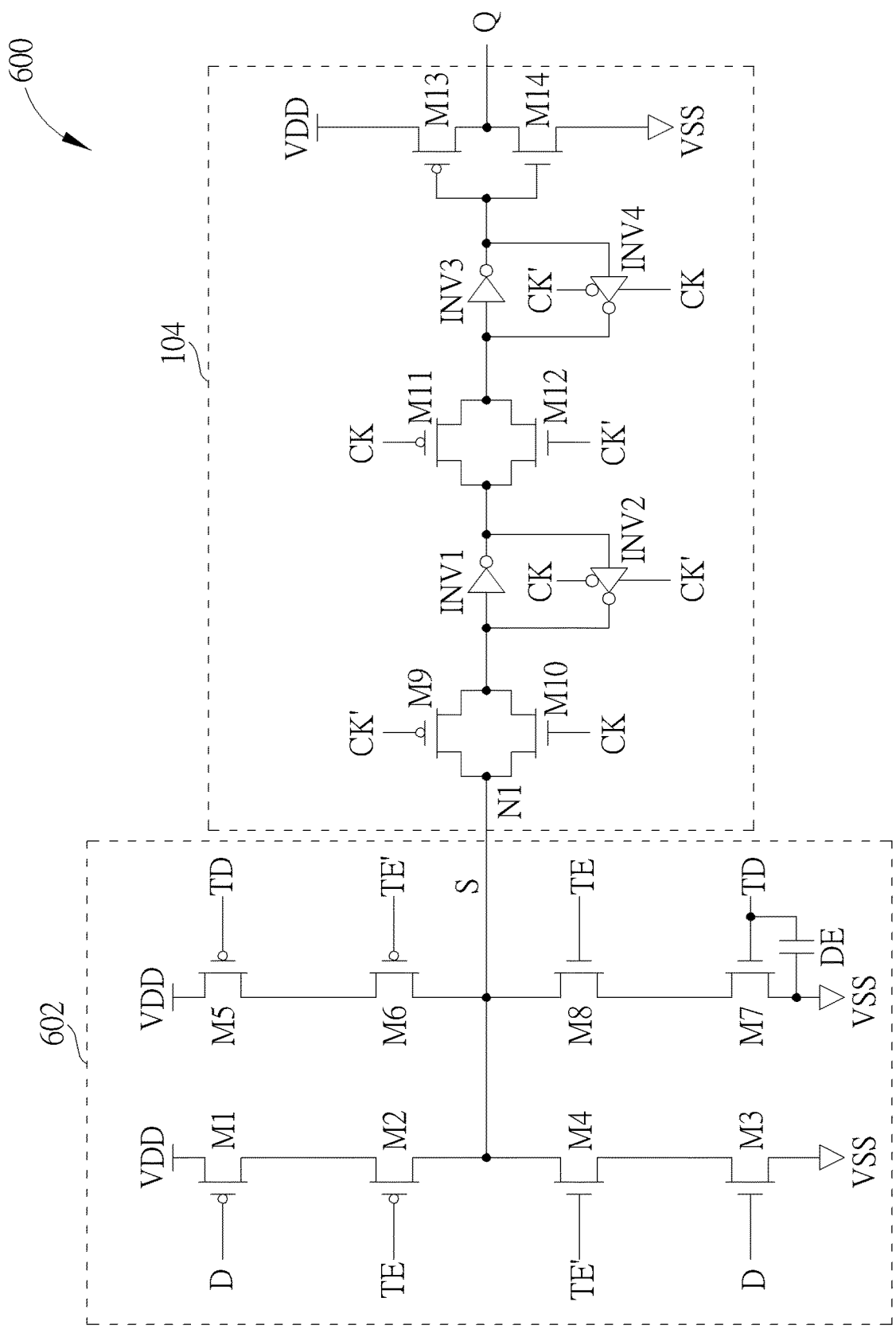
FIG. 6 is a diagram illustrating a processing circuit according to a fourth embodiment of the present invention.

FIG. 6 is a diagram illustrating a processing circuit according to a fourth embodiment of the present invention. The processing circuit 600 includes an input circuit 602 and the aforementioned follow-up circuit 104. By way of example, but not limitation, the processing circuit 600 may be implemented in a flip-flop. The major difference between the input circuit 102 and 602 is that the input circuit 602 has the delay element DE coupled between gate and drain of the transistor M7 to fix the hold fall constraint violation under the test mode (scan mode) of the processing circuit (e.g., flip-flop) 400.

Figure 7:
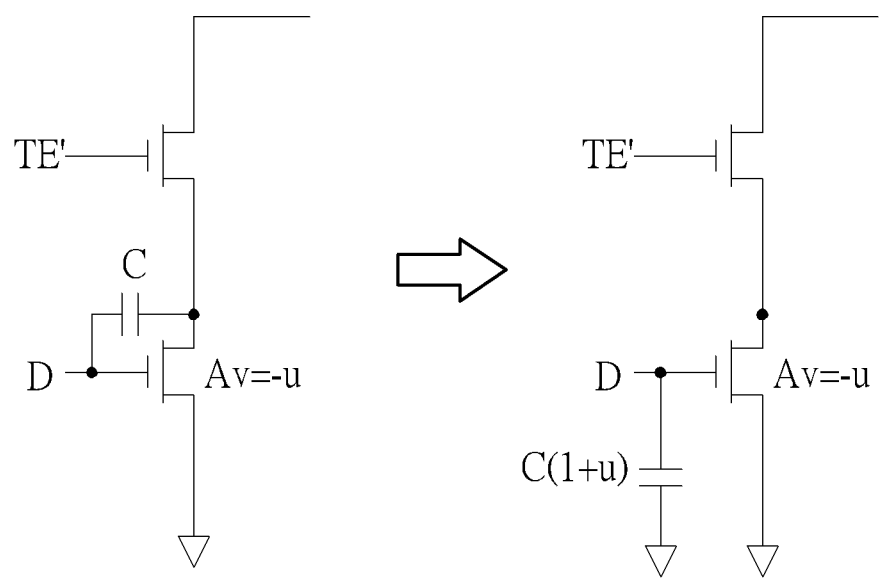
FIG. 7 is a diagram illustrating boosted input capacitance achieved via a capacitive element that is added for fixing the hold time violation.

The delay element DE shown in FIGS. 1 and 4-6 may be implemented using a capacitive element with well-defined capacitance. It should be noted that the capacitive element with well-defined capacitance is intentionally inserted to fix the hold time violation, and is not parasitic capacitance. In addition to fixing the hold time violation, the capacitive element intentionally coupled between gate and drain of one input transistor can further increase the input capacitance. FIG. 7 is a diagram illustrating boosted input capacitance achieved via a capacitive element that is added for fixing the hold time violation. Suppose that the capacitive element intentionally inserted to fix the hold time violation has pre-defined capacitance C, and a voltage gain Av of an input transistor is −u. The Miller capacitance emphasizes the effective input capacitance from C to C(1+u).

Figure 8:
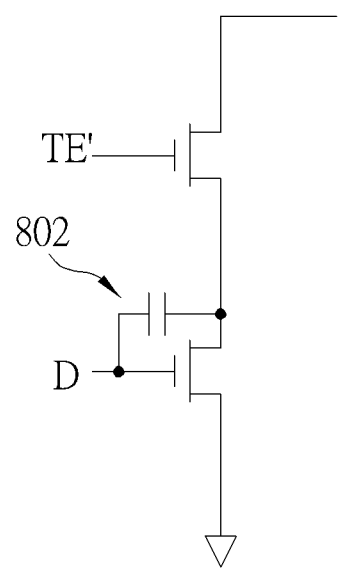
FIG. 8 is a diagram illustrating an example of using a pure capacitor as a hold time fixing element without extra active device.

In some embodiments of the present invention, the delay element DE shown in FIGS. 1 and 4-6 may be a capacitive element implemented by a pure capacitor. FIG. 8 is a diagram illustrating an example of using a pure capacitor 802 as a hold time fixing element without extra active device. For example, the pure capacitor 802 consists of two conductive plates which are separated by the dielectric medium.

Figure 9:
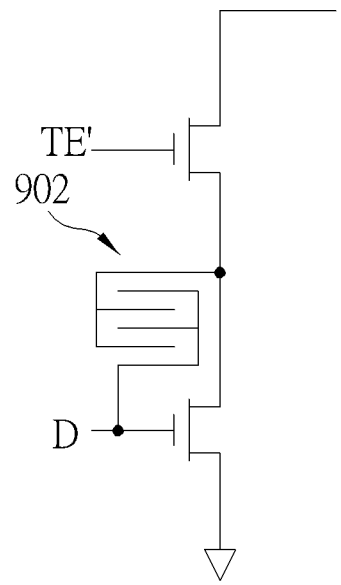
FIG. 9 is a diagram illustrating an example of using an MOM capacitor as a hold time fixing element without extra active device.

In some embodiments of the present invention, the delay element DE shown in FIGS. 1 and 4-6 may be a capacitive element implemented by a metal-oxide-metal (MOM) capacitor. FIG. 9 is a diagram illustrating an example of using an MOM capacitor 902 as a hold time fixing element without extra active device. For certain semiconductor processes, the MOM capacitor 902 may be realized by poly-MD (metal-to-diffusion layer) coupling capacitance.

Figure 10:
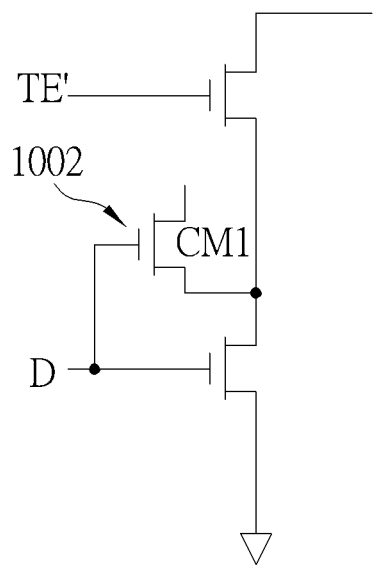
FIG. 10 is a diagram illustrating an example of using a MOS capacitor as a hold time fixing element with extra active device.
Figure 11:
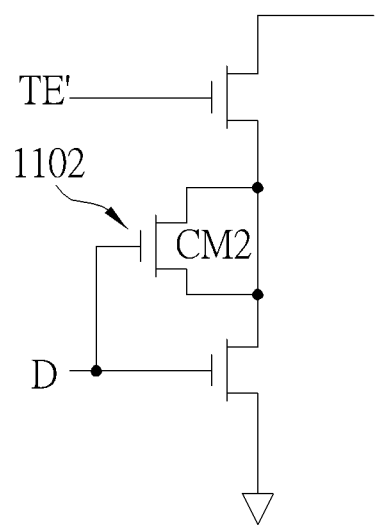
FIG. 11 is a diagram illustrating another example of using a MOS capacitor as a hold time fixing element with extra active device.

In some embodiments of the present invention, the delay element DE shown in FIGS. 1 and 4-6 may be a capacitive element implemented by a metal-oxide-semiconductor (MOS) capacitor. FIG. 10 is a diagram illustrating an example of using a MOS capacitor as a hold time fixing element with extra active device. The MOS capacitor 1002 is implemented by a MOS transistor CM1 having a control terminal (i.e., gate) and two connection terminals (i.e., drain and source). The control terminal of the MOS transistor CM1 is coupled to a control terminal (i.e., gate) of an input transistor, one of the connection terminals of the MOS transistor CM1 is coupled to a connection terminal (i.e., drain) of the input transistor, and the other of the connection terminals of the MOS transistor CM1 is floating. FIG. 11 is a diagram illustrating another example of using a MOS capacitor as a hold time fixing element with extra active device. The MOS capacitor 1102 is implemented by a MOS transistor CM2 having a control terminal (i.e., gate) and two connection terminals (i.e., drain and source). The control terminal of the MOS transistor CM2 is coupled to a control terminal (i.e., gate) of an input transistor, and two connection terminals of the MOS transistor CM2 are both coupled to a connection terminal (i.e., drain) of the input transistor.

Figure 12:
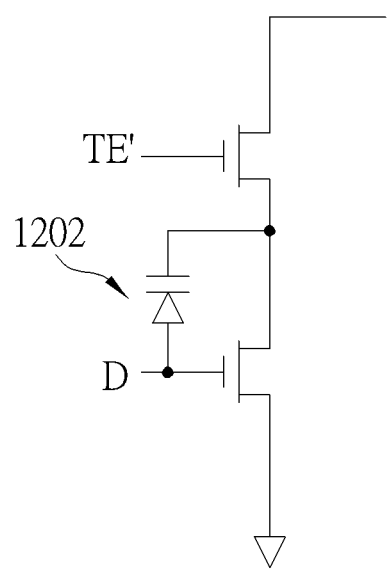
FIG. 12 is a diagram illustrating an example of using a varicap diode as a hold time fixing element with extra active device.

In some embodiments of the present invention, the delay element DE shown in FIGS. 1 and 4-6 may be a capacitive element implemented by a varicap diode. FIG. 12 is a diagram illustrating an example of using a varicap diode 1202 as a hold time fixing element with extra device. In contract to the implementations shown in FIGS. 8-11 that are configured to have fixed capacitance, the implementation shown in FIG. 12 is configured to have adjustable capacitance. Hence, the capacitance required for hold time fixing can be set by properly tuning the varicap diode 1202.

Briefly summarized, one delay element (e.g., capacitive element) DE is intentionally inserted between a control terminal (e.g., gate) and a connection terminal (e.g., drain) of one input transistors for fixing the hold time violation under a normal mode or a test mode (scan mode). Since the delay element (e.g., capacitive element) DE does not have a transistor switching operation compared to the typical hold time fixing buffer or delay cells, the leakage and power penalty can be mitigated greatly. Furthermore, the delay amount imposed by the delay element (e.g., capacitive element) DE can be set by using a capacitance value with fine granularity. Thus, the delay element (e.g., capacitive element) DE can provide fine-grained delay less than one gate delay.

With regard to a digital design flow, a hardware description language (HDL) layout may be further processed in an auto place and route (APR) stage. In some embodiments, a flip-flop cell defined in the HDL design and a proposed flip-flop cell (which uses delay element(s) DE for fixing the hold time violation) available in the APR stage may have the same footprint. In this way, a cell swapping command can be executed in the APR stage to replace the flip-flop cell (which fails to meet the hold time constraint) in the HDL design with the proposed flip-flop cell (which fixes the hold time violation). Moreover, multiple proposed flip-flop cells with the same cell size but different delay amounts (i.e., different hold time fixing capabilities) may be available in the APR stage, and one of the proposed flip-flop cells can be properly selected for replacing at least one flip-flop cell in the HDL design for fixing the hold time violation. The use of the proposed flip-flop cell is compatible with the existing implementation. That is, there is no change of the existing digital design flow.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A processing circuit comprising:
   an input circuit, comprising:
      a first transistor, having a first connection terminal, a second connection terminal, and a control terminal, wherein the control terminal of the first transistor is arranged to receive a data signal;
      a second transistor, having a first connection terminal, a second connection terminal, and a control terminal, wherein the first connection terminal of the second transistor is coupled to the second connection terminal of the first transistor, and the control terminal of the second transistor is arranged to receive a first non-data signal; and
      a delay element, coupled between the control terminal and the second connection terminal of the first transistor; and
   a follow-up circuit, arranged to receive a data input from the input circuit and generate a data output according to the data input, wherein the data input is received at an input node of the follow-up circuit, and the input node of the follow-up circuit is coupled to the second connection terminal of the second transistor.

2. The processing circuit of claim 1, wherein the delay element is a capacitive element.

3. The processing circuit of claim 2, wherein the capacitive element is a pure capacitor.

4. The processing circuit of claim 2, wherein the capacitive element is a metal-oxide-metal (MOM) capacitor.

5. The processing circuit of claim 2, wherein the capacitive element is a metal-oxide-semiconductor (MOS) capacitor implemented by a MOS transistor, a control terminal of the MOS transistor is coupled to the control terminal of the first transistor, and a first connection terminal of the MOS transistor is coupled to the second connection terminal of the first transistor.

6. The processing circuit of claim 5, wherein a second connection terminal of the MOS transistor is coupled to the second connection terminal of the first transistor.

7. The processing circuit of claim 2, wherein the capacitive element is a varicap diode.

8. The processing circuit of claim 1, wherein the processing circuit is implemented in a flip-flop.

9. The processing circuit of claim 8, wherein the data signal is a normal-mode data input of the flip-flop.

10. The processing circuit of claim 8, wherein the data signal is a test-mode data input of the flip-flop.

11. The processing circuit of claim 1, wherein the input circuit further comprises:
   a third transistor, having a first connection terminal, a second connection terminal, and a control terminal, wherein the control terminal of the third transistor is arranged to receive the data signal; and
   a fourth transistor, having a first connection terminal, a second connection terminal, and a control terminal, wherein the first connection terminal of the fourth transistor is coupled to the second connection terminal of the third transistor, the control terminal of the fourth transistor is arranged to receive a second non-data signal that is an inverse of the first non-data signal, and the second connection terminal of the fourth transistor is coupled to the input node of the follow-up circuit.

12. The processing circuit of claim 11, wherein the first connection terminal of the first transistor is arranged to receive a first reference voltage, the first connection terminal of the third transistor is arranged to receive a second reference voltage that is lower than the first reference voltage.

13. The processing circuit of claim 12, wherein the data input of the follow-up circuit is derived from the data signal when the second transistor is turned on by the first non-data signal and the fourth transistor is turned on by the second non-data signal.

14. The processing circuit of claim 13, wherein the second transistor and the fourth transistor are turned on when the processing circuit operates in a normal mode.

15. The processing circuit of claim 13, wherein the second transistor and the fourth transistor are turned on when the processing circuit operates in a test mode.

16. The processing circuit of claim 11, wherein the first connection terminal of the first transistor is arranged to receive a first reference voltage, the first connection terminal of the third transistor is arranged to receive a second reference voltage higher than the first reference voltage.

17. The processing circuit of claim 16, wherein the data input of the follow-up circuit is derived from the data signal when the second transistor is turned on by the first non-data signal and the fourth transistor is turned on by the second non-data signal.

18. The processing circuit of claim 17, wherein the second transistor and the fourth transistor are turned on when the processing circuit operates in a normal mode.

19. The processing circuit of claim 17, wherein the second transistor and the fourth transistor are turned on when the processing circuit operates in a test mode.

20. A processing circuit, implemented in a flip-flop, comprising:
  an input circuit, comprising:
    a first transistor, having a first connection terminal, a second connection terminal, and a control terminal, wherein the control terminal of the first transistor is arranged to receive a first data signal;
    a second transistor, having a first connection terminal, a second connection terminal, and a control terminal, wherein the first connection terminal of the second transistor is coupled to the second connection terminal of the first transistor, and the control terminal of the second transistor is arranged to receive a first non-data signal;
    a third transistor, having a first connection terminal, a second connection terminal, and a control terminal, wherein the control terminal of the third transistor is arranged to receive the first data signal;
    a fourth transistor, having a first connection terminal, a second connection terminal, and a control terminal, wherein the first connection terminal of the fourth transistor is coupled to the second connection terminal of the third transistor, and the control terminal of the fourth transistor is arranged to receive a second non-data signal that is an inverse of the first non-data signal;
    a fifth transistor, having a first connection terminal, a second connection terminal, and a control terminal, wherein the control terminal of the fifth transistor is arranged to receive a second data signal;
    a sixth transistor, having a first connection terminal, a second connection terminal, and a control terminal, wherein the first connection terminal of the sixth transistor is coupled to the second connection terminal of the fifth transistor, and the control terminal of the sixth transistor is arranged to receive the second non-data signal;
    a seventh transistor, having a first connection terminal, a second connection terminal, and a control terminal, wherein the control terminal of the seventh transistor is arranged to receive the second data signal;
    an eighth transistor, having a first connection terminal, a second connection terminal, and a control terminal, wherein the first connection terminal of the eighth transistor is coupled to the second connection terminal of the seventh transistor, and the control terminal of the eighth transistor is arranged to receive the first non-data signal; and
    at least one delay element, coupled between the control terminal and the second connection terminal of at least one of the first transistor, the third transistor, the fifth transistor, and the seventh transistor; and
  a follow-up circuit, arranged to receive a data input from the input circuit and generate a data output according to the data input, wherein the data input is received at an input node of the follow-up circuit, and the input node of the follow-up circuit is coupled to the second connection terminal of the second transistor, the second connection terminal of the fourth transistor, the second connection terminal of the sixth transistor, and the second connection terminal of the eighth transistor;
  wherein one of the first data signal and the second data signal is a normal-mode data input of the flip-flop, and another of the first data signal and the second data signal is a test-mode data input of the flip-flop.

* * * * *